United States Patent [19]
Jensen et al.

[11] Patent Number: 6,030,709
[45] Date of Patent: Feb. 29, 2000

[54] ELECTRONIC COMPONENT

[75] Inventors: Niels Due Jensen; Tina Romedahl Brown; Karsten Dyrbye; Per Ellemose Andersen, all of Bjerringbro, Denmark

[73] Assignee: Grundfos A/S, Bjerringbro, Denmark

[21] Appl. No.: 08/837,265

[22] Filed: Apr. 11, 1997

[30] Foreign Application Priority Data

Apr. 12, 1996 [DE] Germany ................... 196 14 459

[51] Int. Cl.[7] .................... B32B 9/04; B32B 15/00; H01L 29/12; H01C 3/04
[52] U.S. Cl. ................... 428/446; 428/620; 428/641; 338/25; 338/42; 73/700; 73/706; 73/753; 73/754; 438/53; 438/54
[58] Field of Search ................... 428/620, 622, 428/623, 626, 627, 446, 641; 73/700, 706, 715, 753, 754; 438/53, 54; 338/25, 42, 13

[56] References Cited

U.S. PATENT DOCUMENTS

| 4,686,764 | 8/1987 | Adams et al. ............. 29/592 |
| 4,732,042 | 3/1988 | Adams ..................... 73/706 |

| 4,999,317 | 3/1991 | Lu et al. ................. 437/189 |

FOREIGN PATENT DOCUMENTS

| 0588603 | 4/1993 | European Pat. Off. . |
| 0537710 | 3/1994 | European Pat. Off. . |
| 3606850 | 9/1987 | Germany . |
| 3814444 | 11/1988 | Germany . |
| 4216150 | 11/1992 | Germany . |

OTHER PUBLICATIONS

"Phase Separation in Interactions of Tantalum–Chromium Alloy on SI", C. J. Palmstrom, J. Gyulai and J. W. Mayer, J. Vac. Sci. Technol. A 1(2), Apr.–Jun. 1983, 0734–2101/83/020452–03, 1983 American Vacuum Society, pp. 452–454.

*Primary Examiner*—Paul Thibodeau
*Assistant Examiner*—Holly C. Rickman
*Attorney, Agent, or Firm*—Jacox, Meckstroth & Jenkins

[57] ABSTRACT

The invention relates to an electronic component manufactured in thick film technology, thin film technology or silicon technology and then provided with an electrically insulating layer which is covered by an amorphous metal layer. The amorphous metal layer protects the component, even with the smallest of layer thicknesses, from external influences and directly transmits heating and force effects.

15 Claims, 6 Drawing Sheets

ELECTRONIC COMPONENT

BACKGROUND OF THE INVENTION

The invention relates to an electronic component which is produced with thick film technology, thin film technology or silicon technology.

Such electronic components are produced and applied in many different embodiments. In particular, when such an electronic component comprises or forms a sensor and is provided for measuring physical magnitudes, particular problems arise with regard to the encapsulation. On the one hand the component must be encapsulated as tightly as possible with regard to the surrounding medium, and on the other hand, the material covering the component must be applied as thinly as possible so that for example the temperature conduction to the component but also the forces affecting the component are transmitted as directly and as unadulterated as possible.

The usual embedding in plastics is mostly sufficient when merely the surrounding air comes into contact with the component. If however the component comes into contact with fluid for example such as water, alcohol, oil or likewise, then this embedding in a plastics mass is not usually adequate, since such plastic is not sufficiently sealing with respect to such fluids. The fluid may be diffused through the plastic and thus can reach to the electronic component which may become damaged or even destroyed by this direct contact. A certain improvement may be achieved in that the embedding plastic layer is formed correspondingly thick, which however leads to those previously mentioned disadvantages such as lack of heat conduction or bad force transmission. A reliable encapsulation with respect to fluids is normally only made possible with metal encapsulation which is effected by incorporating the component in correspondingly formed sheeting. Although the heat conduction of such sheeting is good, a coupling of the component to the sheeting is required and besides, the force transmission onto the component through the sheeting is practically not possible.

In order to have as good as possible transmission of force onto the component of the type mentioned, it is known for example from U.S. Pat No. 4,686,764 and U.S. Pat. No. 4,732,042 to cover the component, which here is applied as a membrane of a differential pressure sensor, with a relatively thick layer of gel, which on the one hand is so flexible that it hardly inhibits either the transmission of force onto the membrane or the movement of the membrane, but is otherwise so resistant that it does not come off when subjected to flow. Although in this manner, pressure forces may be transmitted onto the membrane quite well, the transfer of heat from the prevailing fluid onto the component is effected with a notable time delay at the minimum, since the design for holding the gel layer onto the component as well as the gel layer itself prevent a fast transfer of heat. Such an arrangement is thus not so suitable for measuring temperatures or transferring of heat.

SUMMARY OF THE INVENTION

Proceeding from this it is the object of the invention to provide a component of the type previously mentioned which on the one hand is reliably protected against external influences, in particular environmental influences, water and likewise, and on the other hand has a good heat and force conducting connection with the surrounding medium.

In one aspect, this invention comprises an electronic component which is manufactured by thick film technology, thin film technology or silicon technology comprising membrane comprising at least one electrical component, an insulating layer deposited on the membrane and at least one electrical component for insulating the at least one electrical component, and an amorphous metal layer deposited on the insulating layer protecting at least one electrical component from fluid and the insulating layer insulating the amorphous metal layer from the at least one electrical component in order to prevent the amorphous layer from providing an electrically conductive connection among the at least one electrical component. The invention thus provides for the electronic component to be provided with an amorphous metal layer. According to the type and embodiment of the electronic component, this amorphous metal layer, where appropriate, is firstly electrically separated from the component by depositing an electrically insulating layer. Since on the one hand the amorphous metal layer, also known by the expression metal glass, due to its amorphous structure, is completely fluid tight even with layer thicknesses of the order of $\mu$m, and on the other hand has a high hardness, such a metal layer firstly provides good protection for the component, and secondly, with an appropriatly small as possible layer thickness, permits an almost perfect, practically undelayed thermal conductivity from the surrounding medium to the component and vice versa. Furthermore, forces, in particular pressure forces of the prevailing medium, are transmitted to the electronic component almost without loss and with a high accuracy. The latter is then particularly advantageous when the component is designed as a sensor for pressure or other forces or comprises such a sensor.

The electronic component according to the invention offers a wide range of application possibilities. For example it may serve as a pressure and/or temperature sensor. It is however also conceivable to design the component according to the invention as a heat producing resistance as part of a measuring apparatus for measuring the flow velocity. In this case, a heating element as well as a temperature probe or probes may be formed as an electronic component according to the invention. The high thermal conductivity of the thin metal layer permits a very exact and quick measurement. Because of the small thickness of the layer, a good thermal conductivity transverse to the layer and a poor thermal conductivity along the layer is provided. This is particularly advantageous for the application of the component as part of a discharge measuring apparatus.

In an analogous manner, the component according to the invention may also be provided for a cooling liquid or other cooling medium to be used for removing waste heat arising therein. Here the good thermal conductivity of the extremely thin layer is advantageous, whereby the component itself is reliably protected from outside influences by this layer. This is because the amorphous metal layer described in more detail hereinafter is considerably more corrosion and wear resistant than for example thin stainless steel sheeting, which in a thickness which is fluid tight, already has such a stiffness that it is suitable for transmitting forces onto the electronic component only under very limited circumstances.

A further advantage of the component according to the invention lies in the fact that the amorphous metal layer is self-conducting, so that it can also serve as a shielding by connecting this layer to earth or any chosen potential.

Finally such an amorphous metal layer may be cheaply manufactured, also particularly in large series production. The components may be manufactured in a known manner as several components arranged next to one another in the form of a wafer or oblate, then covered with an electrically insulating layer and finally vapor deposited with an amorphous metal layer. Only then is the separation of the individual components from one another effected.

The electrically insulating layer may be extremely thin, since it merely has the job of ensuring that the amorphous metal layer does not cause a short circuiting of the electronic component located thereunder. On the other hand, the insulating layer is well protected by the amorphous metal layer. Due to the fact that the metal layer is not in a crystalline structure but an amorphous structure, on the one hand it is highly resistant to corrosion, and on the other it is fluid and also gas tight, even with the thinnest layer thicknesses. Such amorphous metal layers are for example known from EP-A-0537710, DE-A-4216150 and DE-A-3814444. In this respect the following publication is referred to: Palmström, C. J.; J. Gylai and J. W. Meyer in J. Vac. Sci. Technol. A1C21 April–June 1983, sides 452 ff.

Preferably the component, particularly when designed as a membrane, is essentially made from silicon. The electrically insulating layer may then be composed of silicon oxide, silicon nitride or polyimide. The covering amorphous metal layer is preferably chrome-tantalum based or chrome-titanium based, since these have a high resistance to wear and have good elastic characteristics over a wide composition range.

In order to ensure that the amorphous metal layer is fluid tight, the layer thickness should be at least 0.1 $\mu$m, this corresponds to about 700 atom layers. On the other hand the metal layer should be as thin as possible for those reasons cited earlier. Thus the maximum layer thickness should be approximately 5 $\mu$m. Preferably the range is between 0.5 and 1.5 $\mu$m, with which on the one hand a reliable sealing of the amorphous metal layer is ensured, and on the other hand a high mobility of this amorphous metal layer is guaranteed, this being particularly advantageous when transmitting forces.

If the component is to form part of a differential pressure sensor then it is useful when the membrane is part of a plate shaped substrate which forms the electronic component and is designed as one piece with the membrane. The membrane region is then so designed, that here the substrate has a smaller thickness such that a region for deflection is created. Moreover then the whole substrate may be covered, first with the electrically insulating layer and then the metal glass layer. This also has advantages with the gripping of the so designed sensor element. The amorphous metal layer then forms the protective layer with respect to the medium whose pressure is to be measured. With such an arrangement, such a previously mentioned layer of gel may be completely done away with. Temperature compensation of the measurement may be effected very exactly on account of the good heat conduction, in the case that this should still be required despite the direct arrangement of the sensor electronics.

BRIEF DESCRIPTION OF THE SEVERAL VIEWS OF THE DRAWING

The invention is hereinafter described in more detail by the embodiment examples shown in the drawings. These show.

DETAILED DESCRIPTION OF THE INVENTION

Figure 1:
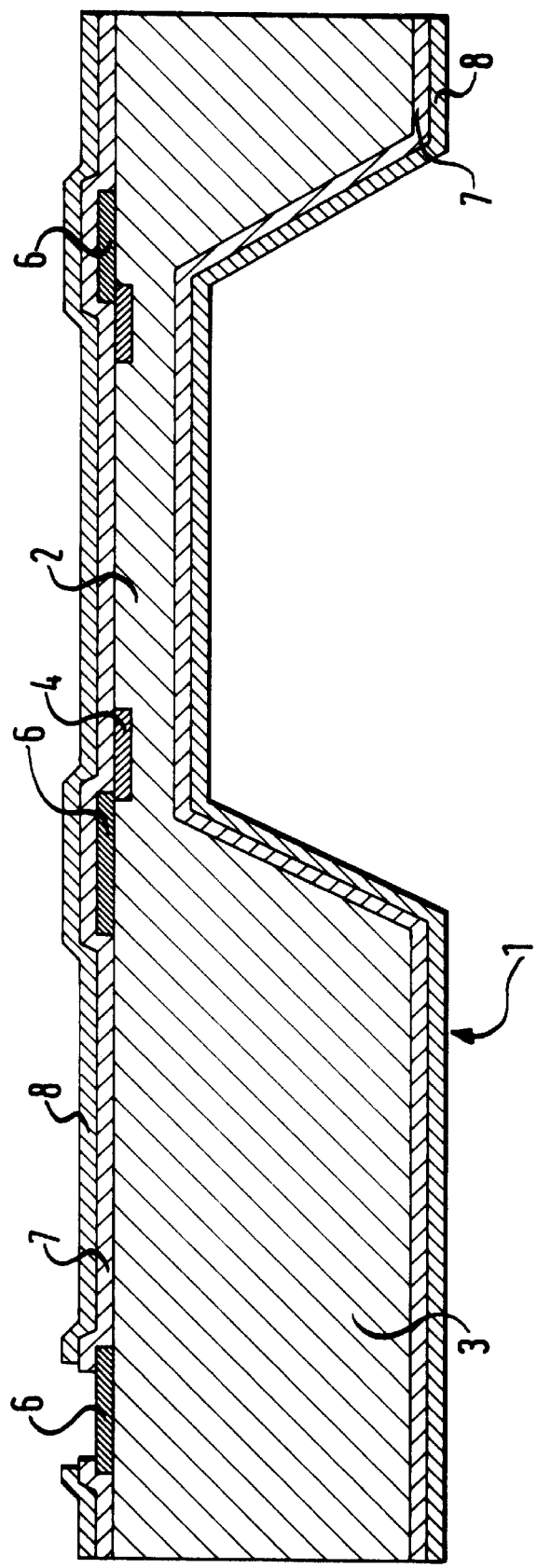
FIG. 1 in schematic representation, a longitudinal section through a substrate with a membrane located therein, FIG. 2 a plan view of the substrate according to FIG. 1, but without covering layers, FIG. 3 a much simplified representation of a longitudinal section through the mounting in the region of the gripping location, FIG. 4 another embodiment of the gripping in the representation according to FIG. 3, FIG. 5 a part of the mounting with the sealing element and substrate in an exploded representation and FIG. 6 the further part of the mounting of FIG. 5.
Figure 2:
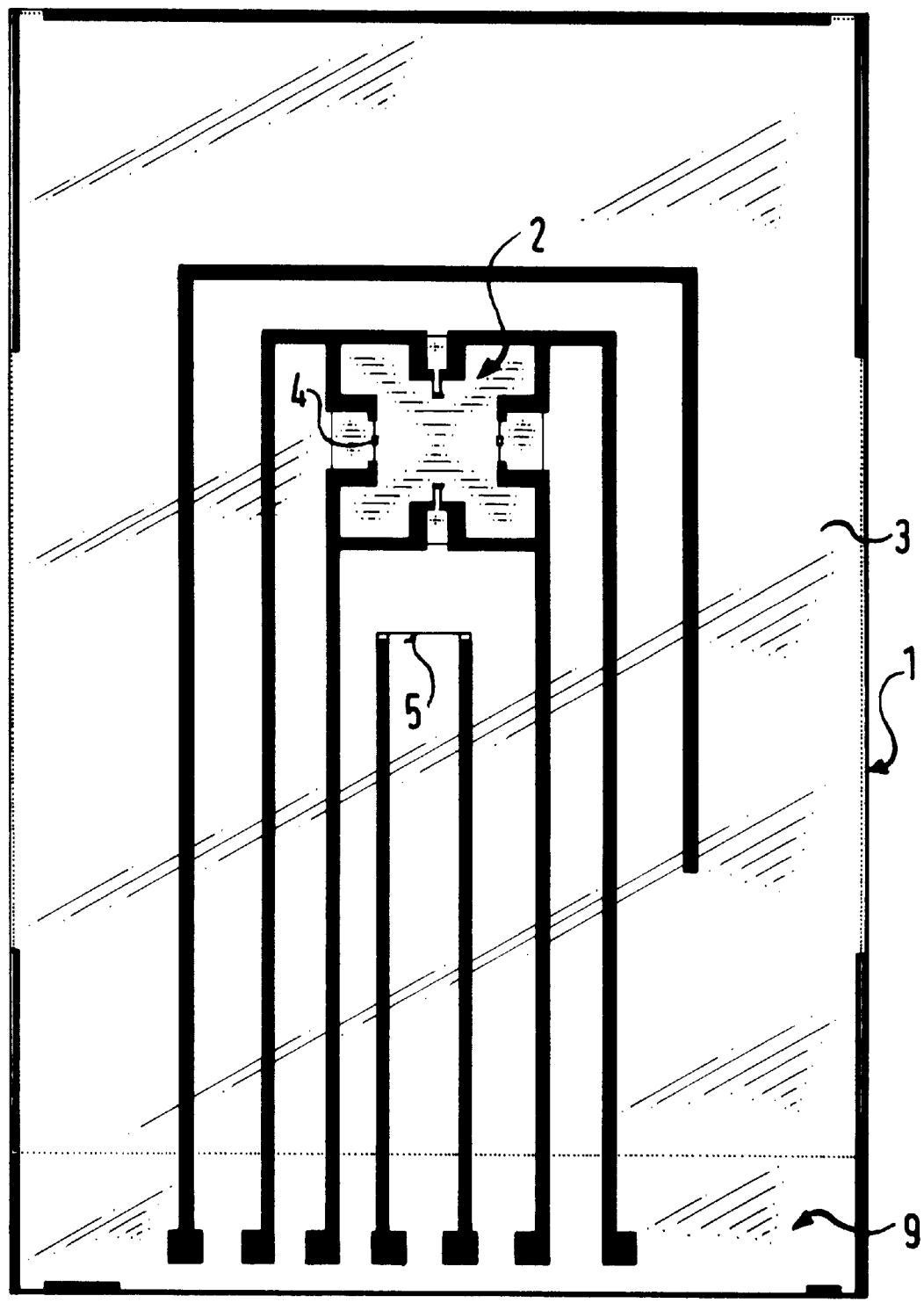

The carrier 1, represented by way of FIGS. 1 and 2, in the plan view, has a roughly rectangular shape. It comprises a much reduced thickness in a middle, roughly quadratic region. This region 2 forms the membrane of a pressure or differential pressure sensor, whilst the remaining carrier is to be regarded as essentially rigid. The carrier 1 and the membrane 2 are formed from silicon. In the region of the membrane, four resistances 4 for determining the membrane deflection as well as a further resistance 5, directly neighbouring the membrane 2, for temperature compensation of the sensor, are deposited on the silicon base body 3. The electrical connection of the resistances 4 and 5 is effected via strip conductors 6 made from aluminium, which are likewise deposited directly onto the carrier 1. The arrangement of the conductors to the resistances 4 is already preparedly formed as a bridge circuit which lays the contact points to the strip conductors 6 for further wiring all along one side of the carrier, this being distant to the membrane 2.

The membrane 2 and carrier 1 are covered on both sides with a silicon oxide layer 7. This layer 7 is directly deposited onto the silicon base body 3 or the resistances 4 and 5 as well as the strip conductors 6. The silicon oxide layers 7 on both sides of the carrier 1 are each covered by a metal glass layer 8. This amorphous metal layer is vapor deposited and comprises a thickness of about 1 $\mu$m, which is about 7,000 atom layers. The metal glass layer 8 is impervious to fluid and gas. It has a considerably higher resistance to corrosion and greater hardness in comparison to crystalline stainless steels. It however practically does not inhibit the measuring characteristics of the membrane 2, since this layer deforms only elastically. Thus it protects the membrane from external influences in an almost optimal manner. In order to prevent a short circuit by the metal glass layer 8 of the resistances and strip conductors formed on the silicon base body 3, the electrically insulating silicon oxide layer 7 is provided.

With the embodiment example described, the metal glass layer 8 is comprised from an amorphous metal alloy based on chrome-tantalum or chrome-titanium. In this respect the document EP-A-0537710 is referred to.

As shown in FIG. 2, a strip 9 is provided running parallel to the narrow side of the carrier 1 and in which the strip conductors 6 are neither covered by a silicon oxide layer 7 nor by a metal glass layer 8. Here the strip conductors 6 run out for the purpose of contacting (bonding).

Figure 3:
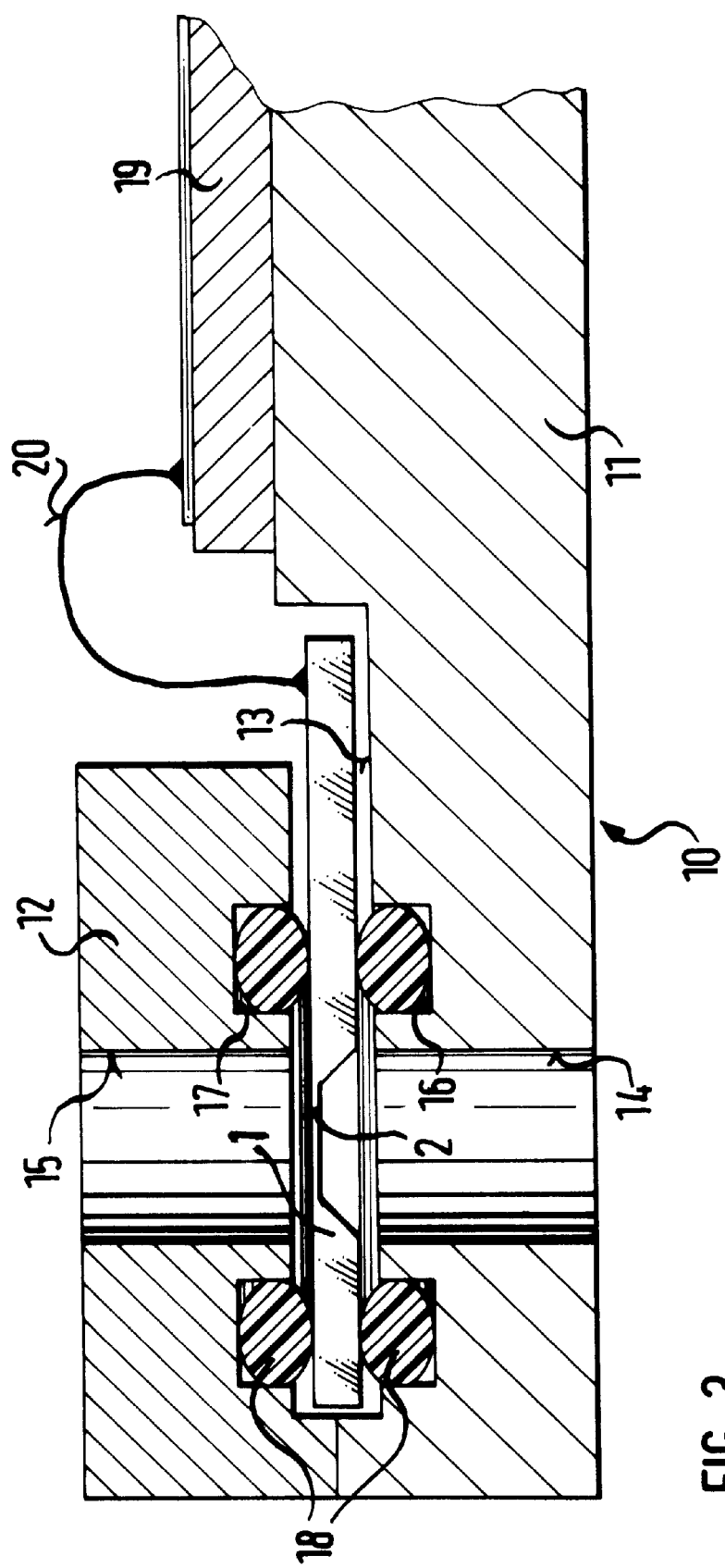

The previously described carrier is incorporated in a pressure tight manner into a mounting 10, in an such a manner that the membrane 2 is impingable on both sides. This is shown schematically by way of FIG. 3. Here the mounting 10 (FIG. 3) comprises a plate shaped base body 11 and a cover plate 12 which are connected to one another under incorporation of the carrier. The plate shaped base body 11 comprises a plane recess 13, roughly the size of the carrier 1, for receiving this carrier. Furthermore, the base body 11 and the cover plate 12 comprise recesses 14 and 15 which are flush with one another and through which the membrane 2 can be impinged by fluid. Concentric to their recesses 14 and 15, the components 11 and 12 each comprise annular grooves 16 and 17, in which O-rings 18 lie, which grip the carrier between the components 11 and 12 in an airtight manner. The arrangement is chosen such that the membrane 2 is freely accessible within the recesses 14 and 15, whilst the strip 9 which is provided for contacting the ends of the strip conductors 6, lies on the other side of the seal within the mounting 10. Moreover, the mounting is so formed that only the region of the recesses 14 and 15 can be impinged by fluid, but the remaining part is sealed with respect to the fluid.

Arranged on the base body 11 is a circuit board 19 which comprises further electronic components for processing the measuring signal. This circuit board 19 is electrically connected to the strip conductors 6 of the carrier 1 via a conductor 20. The contacting is effected by soldering or welding the conductor 20 onto the ends of the strip conductors 6 made freely accessible by way of the strips 9 (so-called bonding).

Figure 5:
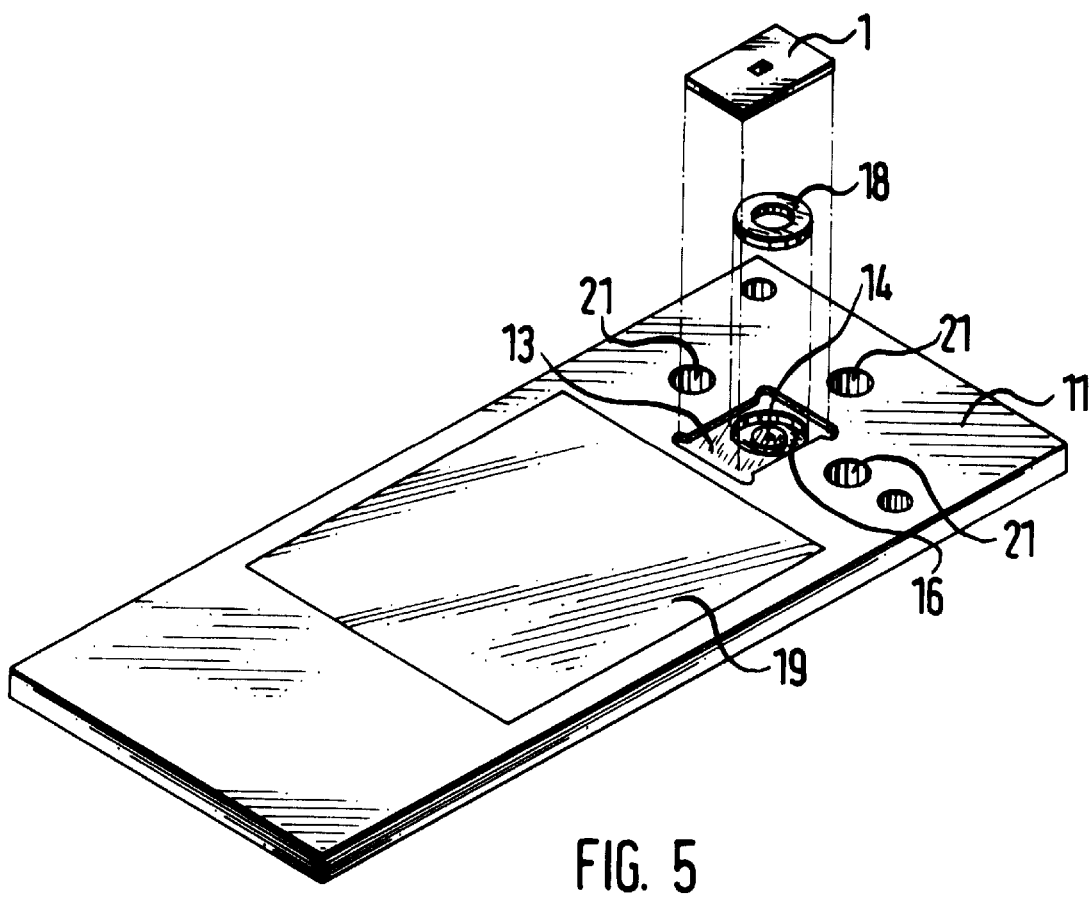
Figure 6:
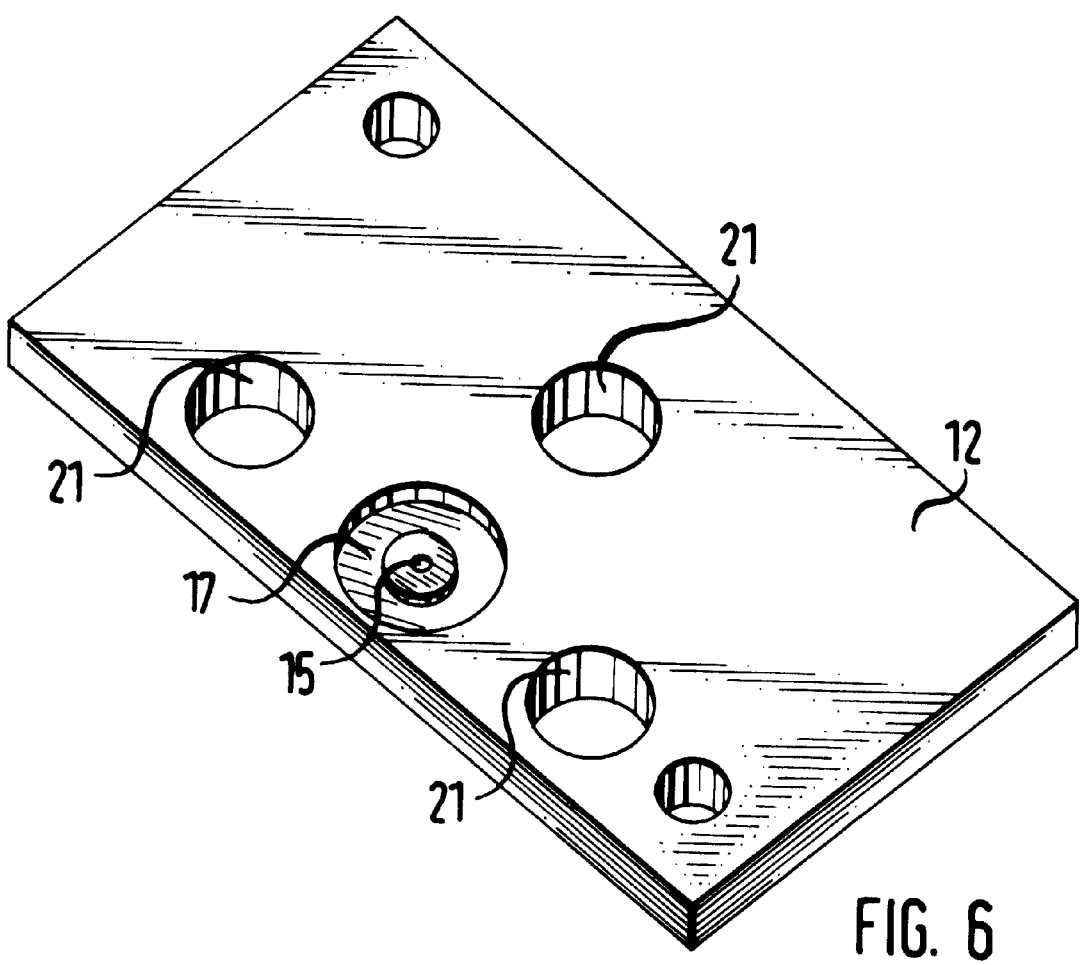

The electronic, electrical and structural construction of the differential pressure sensor is accomplished in the usual way and is thus not descibed in detail here. The construction, as far as the mounting is concerned, is made clearer by way of FIGS. 5 and 6. Here, for connecting the plate shaped components 11 and 12, bores 21 are arranged next to the recess 13 flush in the base body 11 and cover plate 12, through which a screw or rivet connection can be made between the two components.

Such a designed sensor may be applied as a pressure sensor when the membrane 2 is only impinged on by pressure from one side. For application as a differential pressure sensor, the membrane is impinged on by fluid from both sides.

Figure 4:
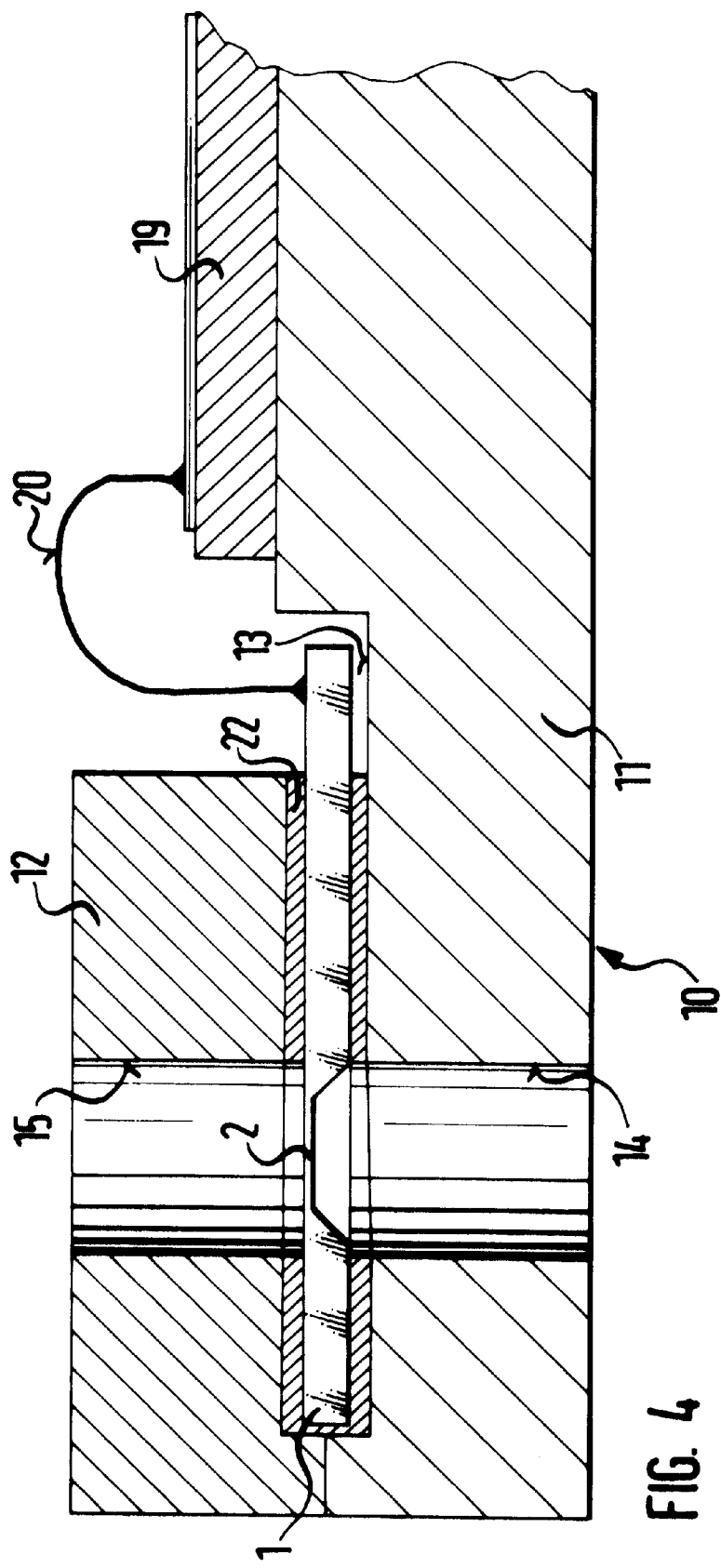

By way of FIG. 4 and alternative gripping of the carrier 1 between the components 11 and 12 is represented. This embodiment example differs from that represented by way of FIG. 3 in that the annular grooves 16, 17 as well as the O-rings 18 are done away with and instead the carrier 1 is incorporated between the plate shaped base body 11 and the cover plate 12 by way of an adhesive layer 22. This incorporation is advantageous inasmuch as the occurring stress in the carrier 1 and in the membrane is much less than with the previously described gripping. This is advantageous with regard to the measuring accuracy and linearity of the measurement. In any case, however, the gripping of the carriers 1 between the components 11 and 12 is effected before the contacting of the ends of the strip conductors 6, since the comparatively sensitive carrier 1 after incorporation into the holder 10 is much more simple and secure to operate.

We claim:

1. An electronic component which is manufactured by thick film technology, thin film technology or silicon technology, comprising:
   a membrane having at least one electrical component disposed on said membrane;
   an insulating layer deposited on said membrane and said at least one electrical component for insulating said at least one electrical component; and
   an amorphous metal layer deposited on said insulating layer,
   said amorphous metal layer protecting said at least one electrical component from fluid and said insulating layer insulating said amorphous metal layer from said at least one electrical component in order to prevent an electrical conductive connection between said amorphous metal layer and said at least one electrical component.

2. A component according to claim 1, characterized in that said at least one electrical component comprises a sensor for measuring at least one physical magnitude or is such a sensor.

3. A component according to claim 1, wherein said membrane comprises a reduced-thickness region comprising said at least one electrical component wherein said at least one electrical component comprises a pressure sensor, wherein said amorphous metal layer forms a protective layer with respect to a fluid whose pressure is to be measured.

4. A component according to claim 1, characterized in that the membrane is silicon, the electrically insulating layer is composed of silicon oxide, silicon nitrite or polyimide, and that the amorphous metal layer comprises chrome tantalum.

5. A component according to claim 1, characterized in that the membrane is a plate shaped substrate.

6. A component according to claim 1, characterized in that the amorphous metal layer (8) has a thickness of 0.1 to 5 $\mu$m.

7. A component according to claim 1, characterized in that said component is a temperature sensor.

8. A component according to claim 1, characterized in that said at least one electrical component and said membrane comprises a temperature sensor.

9. A component according to claim 1 wherein said amorphous layer comprises a thickness of about 0.5 to 1.5 $\mu$m.

10. An electrical component comprising:
    a silicon membrane having at least one electrical component on a surface thereof;
    an insulating layer comprised of silicon oxide, silicon nitrite or polyimide deposited on said silicon membrane for insulating said at least one electrical component; and
    an amorphous layer comprising chrome tantalum or chrome titanium deposited on said insulating layer to prevent fluid from contacting said at least one electrical component;
    said amorphous layer being insulated from said at least one electrical component by said insulating layer such that said amorphous layer does not short circuit said at least one electrical component.

11. The electrical component as recited in claim 10 wherein said at least one electrical component comprises a plurality of resistors which cooperate with said silicon membrane to define a sensor.

12. The electrical component as recited in claim 10 wherein said amorphous layer comprises a thickness of 0.1 to 5 $\mu$m.

13. The electrical component as recited in claim 10 wherein said amorphous layer comprises a thickness of 0.5 to 1.5 $\mu$m.

14. The electrical component as recited in claim 11 wherein said sensor is a pressure sensor.

15. The electrical component as recited in claim 11 wherein said sensor is a temperature sensor.

* * * * *